United States Patent
Hasegawa

(10) Patent No.: US 7,750,563 B2
(45) Date of Patent: Jul. 6, 2010

(54) MULTICOLOR DISPLAY APPARATUS

(75) Inventor: Toshinori Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 714 days.

(21) Appl. No.: 11/739,779

(22) Filed: Apr. 25, 2007

(65) Prior Publication Data

US 2007/0252520 A1    Nov. 1, 2007

(30) Foreign Application Priority Data

Apr. 26, 2006   (JP)   ............................ 2006-121960
Apr. 10, 2007   (JP)   ............................ 2007-102752

(51) Int. Cl.
*H01J 1/62*   (2006.01)
(52) U.S. Cl. ...................................... 313/506; 313/512
(58) Field of Classification Search .......... 313/504–512
See application file for complete search history.

(56) References Cited

U.S. PATENT DOCUMENTS 6,831,409 B2   12/2004   Yamada ...................... 313/506

FOREIGN PATENT DOCUMENTS

| JP | 11-329742 | 11/1999 |
| JP | 2002-036770 | 2/2002 |

*Primary Examiner*—Joseph L Williams
(74) *Attorney, Agent, or Firm*—Fitzpatrick, Cella, Harper & Scinto

(57) ABSTRACT

Provided is a multicolor display apparatus including a plurality of organic light-emitting devices each including a pair of electrodes of an anode and a cathode; and an organic compound layer interposed between the pair of electrodes and including a light-emitting layer. The viewing angle characteristics of the organic light-emitting device showing an emission color with a highest visual sensitivity is such that a peak wavelength of emission spectrum and a peak wavelength of multiple interference spectrum due to the organic light-emitting device are offset with respect to each other so that the color shift of a display image on the multicolor display apparatus depending on a viewing angle is suppressed.

4 Claims, 5 Drawing Sheets

MULTICOLOR DISPLAY APPARATUS

BACKGROUND OF THE INVENTION

1. Field of the Invention

The present invention relates to a multicolor display apparatus (hereinafter, simply referred to as "display apparatus") including a plurality of organic light-emitting devices (organic electroluminescent devices (hereinafter, sometimes simply referred to as "device")) each having a pair of electrodes including an anode and a cathode, and a plurality of organic compound layers interposed between the pair of electrodes and including a light-emitting layer.

2. Description of the Related Art

At present, display apparatuses have been vigorously researched and developed. In an organic light-emitting device which constitutes a display apparatus, emitted light is reflected due to various refractive index differences, so that optical interference occurs. The optical interference length in the device will change depending on an angle at which the device is viewed, and the emission spectrum shifts toward shorter wavelengths side. That is, depending on the viewing angle, a red-light-emitting device shows an orange color, a green-light-emitting device shows a blue color, and a blue-light-emitting device shows a deeper blue color. Therefore, when a display apparatus is viewed from an oblique direction, the tints of the respective devices change, with the result that the white balance is lost.

In view of the foregoing, Japanese Patent Application Laid-Open No. H11-329742 (see p. 3, 11. 20 to 35; and FIG. 1) discloses a display apparatus in which the light-extraction side of a device is provided with a light diffusion color filter.

In addition, Japanese Patent Application Laid-Open No. 2002-367770 (see p. 3, 11. 17 to 25; and FIG. 1) discloses a display apparatus having a device provided with an optical resonator structure in which the peak wavelength of emission spectrum and the peak wavelength of multiple interference spectrum due to a resonating portion (wavelength at which light is most intensified by resonance) are offset with respect to each other. In an embodiment of the display apparatus, with respect to the peak wavelength of the emission spectrum, the peak wavelength of the multiple interference spectrum is set to be offset by +10 nm for red color, +4 nm for green color, and −10 nm for blue color. As a result, with the display apparatus, the white color shift at a viewing angle of 60° is suppressed.

Incidentally, a resonator structure is to resonate emitted light in a space (resonating portion) between a reflecting portion and a light-extraction portion located at an upper and a lower portions of a device. Accordingly, it can be said that all devices are each provided with a resonator structure, though differing from each other in the extent of a resonance effect.

With the technique disclosed in Japanese Patent Application Laid-Open No. H11-329742, emitted light is diffused when passing through the color filter, so that the change in tint depending on the viewing angle can be alleviated. However, the technique requires a step of forming the color filter. Accordingly, there is posed the problem such that the constitution of the display apparatus becomes complicated, which reduces the productivity and increases the production cost. In addition, there is also posed the problem that when the color filter is used, only a part of light emitted from a light-emitting layer can be extracted to the outside, which results in a reduction of the light extraction efficiency.

A device provided with a resonator structure is of such a constitution that light corresponding to a resonant wavelength is intensified and extracted to the outside of the device. Accordingly, in order that a narrow spectrum having a high peak intensity may be obtained, the peak wavelength of emission spectrum and the peak wavelength of multiple interference spectrum due to a resonating portion (wavelength at which light is most intensified by resonance) are preferably caused to coincide with each other. In this case, a device having a high efficiency and showing an excellent color purity can be realized. The technique disclosed in Japanese Patent Application Laid-Open No. 2002-367770 described above can suppress a white color shift depending on a viewing angle, but involves a problem in a trade-off relationship with the suppression effect, that the emission efficiency lowers as compared to that in the case where the peak wavelengths are caused to coincide with each other. In particular, when the emission efficiency of a device which shows an emission color with a relatively low luminous efficiency lowers, a larger amount of energy must be input in order that desired luminance may be obtained, so that a problem such as an increase in power consumption of the display apparatus occurs.

SUMMARY OF THE INVENTION

The present invention has been accomplished in view of the above-mentioned problems and provides a display apparatus which does not use an optical filter such as a color filter in combination, has low power consumption, and suppresses the color shift of a display image depending on a viewing angle.

To solve the above-mentioned problems of the background art, according to the present invention, there is provided a multicolor display apparatus including: a plurality of organic light-emitting devices of different emission colors each including a cathode, an anode, and an organic compound layer formed between the cathode and the anode, the organic compound layer including a light-emitting layer, wherein an optical path between a reflective surface which is closer to the cathode than the light-emitting layer is and a reflective surface which is closer to the anode than the light-emitting layer is, is set to serve as a resonating portion of a resonator structure for resonating light emitted by the light-emitting layer; wherein in the organic light-emitting device showing the emission color with a highest visual sensitivity of the plurality of emission colors, a wavelength at which light is most intensified by the resonance is longer than a peak wavelength of an emission spectrum of the light-emitting layer such that a color shift depending on a viewing angle of a white color displayed by mixing the plurality of emission colors is suppressed; and wherein in the organic light-emitting device showing an emission color other than the emission color with the highest visual sensitivity, a wavelength at which light is most intensified by the resonance coincides with a peak wavelength of the emission spectrum of the light-emitting layer.

According to the present invention, there can be provided a display apparatus which does not use an optical filter such as a color filter in combination, shows less color shift of a display image due to viewing angle change, has good viewing angle display quality, and has low power consumption.

Further features of the present invention will become apparent from the following description of exemplary embodiments with reference to the attached drawings.

DESCRIPTION OF THE EMBODIMENTS

Hereinafter, the present invention will be described in detail. The basic constitution of a multicolor display apparatus of the present embodiment (see-FIG. 8 or the like) is substantially identical to that of a conventional multicolor display apparatus, so that the specific features of the present invention are described first with reference to a general organic light-emitting device before the constitution of the multicolor display apparatus of this embodiment is described.

Figure 1:
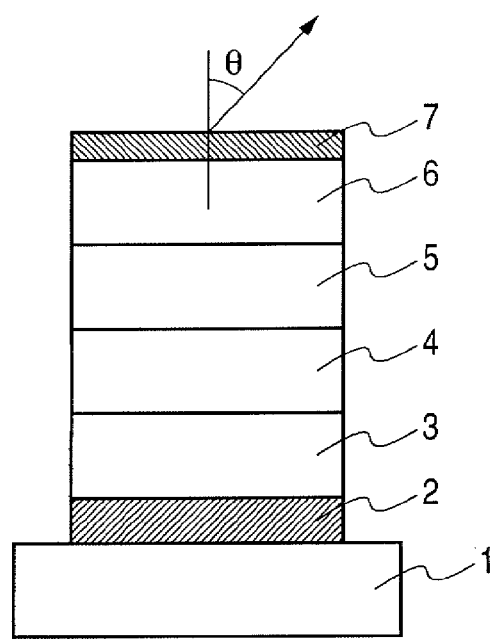
FIG. 1 is a schematic cross-sectional view illustrating a general organic light-emitting device.

FIG. 1 is a schematic enlarged cross-sectional view of a general organic light-emitting device. The device is of such a constitution that on a substrate 1, an anode (reflective electrode) 2, a hole-transporting layer 3, a light-emitting layer 4, an electron-transporting layer 5, an electron injection layer 6, and a cathode (translucent electrode) 7 are provided in the mentioned order. A current is flowed into the device, whereby holes injected from the anode 2 and electrons injected from the cathode 7 recombine in the light-emitting layer 4, thereby causing light emission. Incidentally, the term "organic compound layer" employed herein refers to the hole-transporting layer 3, the light-emitting layer 4, the electron-transporting layer 5, and the electron injection layer 6.

In this embodiment, a constitutional example in which the anode 2 is formed on the substrate 1 is described. However, a cathode 7 (reflective electrode), organic compound layers, and an anode (translucent electrode) 2 may be formed in the mentioned order on a substrate 1. That is, which one of the anode and the cathode is chosen as a reflective electrode and the order in which the respective layers are stacked are not particularly limited. In addition, although in this embodiment, a top emission type display apparatus in which emitted light is extracted from the translucent electrode 7 on a side opposite to the substrate 1 has been adopted, the present invention is applicable also to a bottom emission type display apparatus.

In such device, a resonator structure is formed between an interface between the reflective electrode 2 on the substrate 1 and the hole-transporting layer 3 and an interface between the translucent electrode 7 and the electron injection layer 6 by using the both interfaces as reflective surfaces. An optical path between the upper and the lower electrodes 2 and 7 is represented by L, the peak wavelength of emitted light is represented by λ, and the angle (viewing angle) at which the light emitted from the device is viewed is represented by θ (θ=0° when the light is viewed perpendicularly to a light-emitting surface of the device). In addition, in the case where the sum of phase shifts upon reflection of the emitted light by the respective electrodes 2 and 7 is represented by φ (rad), mutual strengthening due to a resonance effect can be utilized when the respective parameters satisfy the relationship represented by Equation 1.

$$2L \cos\theta + \phi/2\pi = m\lambda (m=1, 2, 3, \ldots) \quad \text{(Equation 1)}$$

Here, the optical path L is the total sum of the optical thicknesses (=refractive index (n)×film thickness (d)) of the organic compound layers present between the upper and the lower electrodes 2 and 7 (n1d1+n2d2+ . . . ). Incidentally, when the emitted light is actually reflected by the respective electrodes 2 and 7, the sum φ of the phase shifts will vary depending on the combination of electrode materials and organic materials which constitute reflective interfaces.

In this embodiment, a silver alloy (AgNiCu) was used as a material for each of the anode 2 and the cathode 7, and the thickness of the anode 2 and the thickness of the cathode 7 were 100 nm and 15 nm, respectively. As to the optical thicknesses (=n×d) of the organic compound layers, two kinds of resonator structures were prepared in which the combinations of the thicknesses were changed as shown in Table 1. As a result of estimation of a multiple interference spectrum by use of a general-purpose optical thin film design software for each of the two kinds of resonator structures, the spectra shown in FIG. 2 were obtained. Incidentally, at that time, the viewing angle was 0°. The peak wavelengths of those multiple interference spectra (wavelengths at which light is most intensified) were 510.0 nm for the Type 1 organic light-emitting device and 521.5 nm for the Type 2 organic light-emitting device, respectively.

TABLE 1

|  | Type 1 | Type 2 |
| --- | --- | --- |
| Electron injection layer | 48.3 nm | 24.1 nm |
| Electron-transporting layer | 17.0 nm | 17.0 nm |
| Light-emitting layer | 46.0 nm | 83.0 nm |
| Hole-transporting layer | 48.6 nm | 48.6 nm |

As described above, by changing the thicknesses of organic compound layers to adjust the optical paths of a resonator structure, the multiple interference spectrum can be adjusted.

Incidentally, in the present invention, an interface on a side of the cathode 7 opposite to the substrate 1 side may be utilized for resonance instead of the interface between the cathode 7 and the electron injection layer 6. In this case, a resonator structure is formed between the interface between the reflective electrode 2 on the substrate 1 and the hole-transporting layer 3 and the interface on the side of the cathode 7 opposite to the substrate 1 side by using the both interfaces as reflective surfaces. That is, in this case, the reflective surface which is closer to the cathode 7 than the light-emitting layer 4 is refers to the interface on the side of the cathode 7 opposite to the substrate 1 side. In order to attain the mutual strengthening due to a resonance effect, it is necessary to satisfy an equation obtained by replacing L in Equation 1 above by L' which represents the optical path between the both interfaces. In addition, in this case, the cathode 7 is preferably a transparent electrode instead of a translucent electrode. The transparent electrode is preferably made of a metal oxide, specifically, ITO, IZO, or the like.

As described above, "a reflective surface which is closer to a cathode than a light-emitting layer is" and "a reflective surface which is closer to an anode than a light-emitting layer is" in the present invention are determined by the layer constitution of an organic light-emitting device. When a layer formed of a metal is disposed, an interface between the layer formed of the metal and a layer which is in contact with the layer serves as a reflective surface. When any layer formed of a metal is not disposed, an interface between layers which provides the largest refractive index difference serves as a reflective surface. However, when the optical path between "the reflective surface which is closer to the cathode than the light-emitting layer is" and "the reflective surface which is closer to the anode than the light-emitting layer is" is large, the mutual strengthening due to resonance does not occur. Accordingly, in the present invention, the distance between the both reflective surfaces needs to be a coherence length. Specifically, the distance between the both reflective surfaces is preferably 5 μm or less. In addition, setting the distance between the both reflective surfaces to 1 μm or less is preferable because a stronger resonance effect can be utilized.

When the viewing angle is changed within the range of 0° to 60° in a device provided with such a resonator structure, the peak wavelength of a multiple interference spectrum shifts to the shorter wavelength according to Equation 1. Table 2 shows the state in which the peak wavelength of a multiple interference spectrum in the Type 1 device varies depending on the viewing angle. The peak wavelength shifts toward shorter wavelengths as the viewing angle increases from 0° to 60°.

TABLE 2

| | Viewing angle | | | | |
|---|---|---|---|---|---|
| | 0° | 15° | 30° | 45° | 60° |
| Peak wavelength | 510.0 nm | 508.2 nm | 499.8 nm | 487.1 nm | 472.7 nm |

Figure 3:
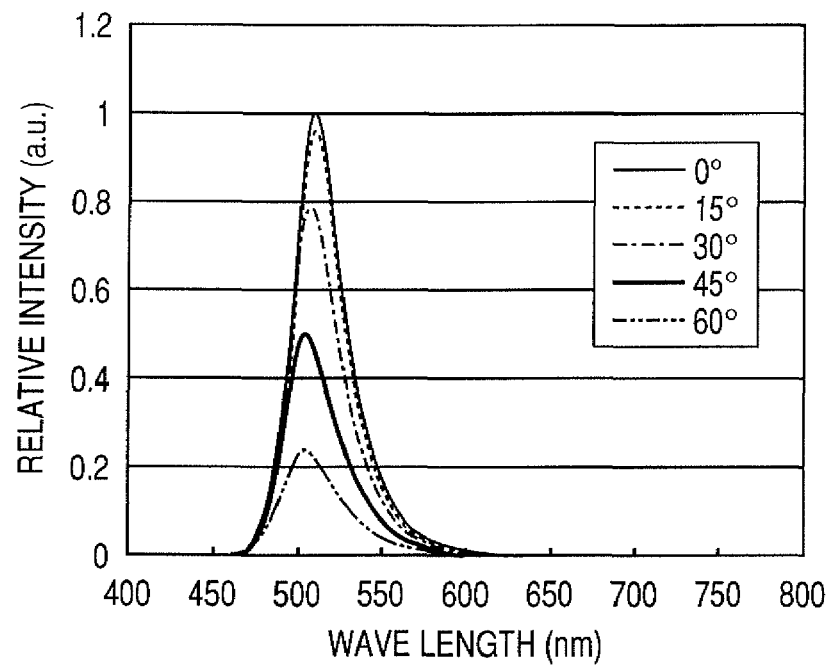
FIG. 3 is a graphical representation illustrating a change in emission spectrum of the Type 1 organic light-emitting device depending on a viewing angle.
Figure 4:
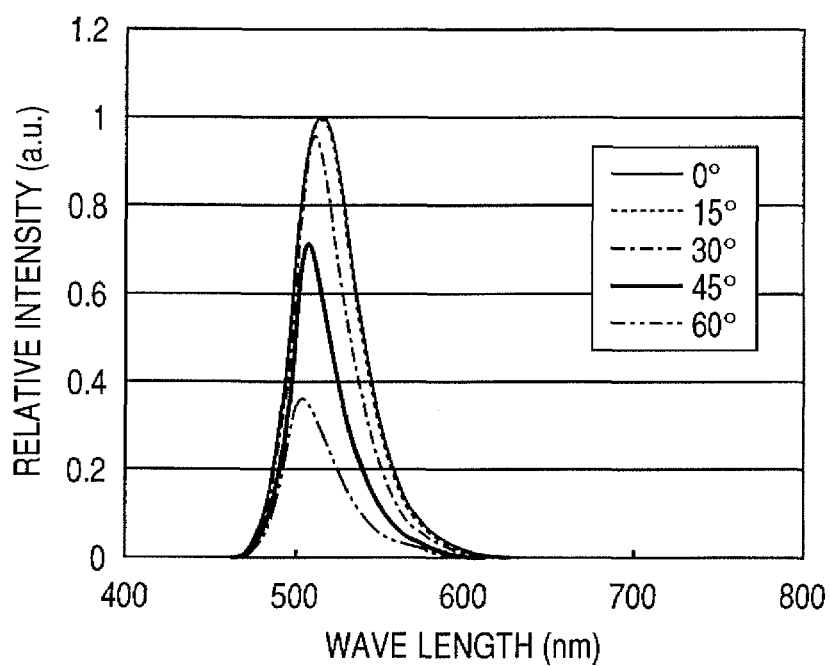
FIG. 4 is a graphical representation illustrating a change in emission spectrum of the Type 2 organic light-emitting device depending on a viewing angle.

The emission spectrum of a device shows viewing angle depending characteristics resulting from a change in multiple interference spectrum that depends on a viewing angle. FIG. 3 shows a change in emission spectrum of a device constitution having the Type 1 film thickness setting depending on a viewing angle by taking the emission of green light having a peak wavelength of 510 nm as an example. FIG. 4 shows a change in emission spectrum of a device constitution having the Type 2 film thickness setting depending on a viewing angle by taking the emission of green light having a peak wavelength of 510 nm as an example. In this case, in Type 1, the peak wavelength of the emission spectrum and the peak wavelength of a multiple interference spectrum coincide with each other, while in Type 2, the peak wavelength of a multiple interference spectrum (wavelength at which light is most intensified by resonance) is set to be offset by +11.5 nm with respect to the peak wavelength of the emission spectrum, that is, the peak wavelength of the multiple interference spectrum is set to be longer than the peak; wavelength of the emission spectrum. Incidentally, when the difference between the peak wavelength of an emission spectrum and the peak wavelength of a multiple interference spectrum is within the range of ±3 nm, the peak wavelengths can be regarded as coinciding with each other. In addition, Table 3 shows a change in peak wavelength of an emission spectrum and a change in relative luminance obtained by normalization with the luminance at a viewing angle of 0° being 1, depending on a difference in device constitution. Further, a chromaticity difference δ calculated by Equation 2 shown below and showing a difference from chromaticity at a viewing angle of 0° is also shown therein.

$$\delta = \sqrt{(x_i - x_o)^2 + (y_i - y_o)^2} \quad \text{(Equation 2)}$$

($x_i$, $y_i$: chromaticity coordinates at a viewing angle of i°; $x_O$, $y_O$: chromaticity coordinates at a viewing angle of 0°)

TABLE 3

| | | θ [deg] | | | | |
|---|---|---|---|---|---|---|
| | | 0° | 15° | 30° | 45° | 60° |
| Type 1 | Peak wavelength | 510.3 nm | 509.5 nm | 506.8 nm | 503.7 nm | 503.4 nm |
| | Relative luminance | 1 | 0.93 | 0.73 | 0.46 | 0.24 |
| | CIE chromaticity coordinates | (0.14, 0.68) | (0.14, 0.68) | (0.13, 0.66) | (0.13, 0.63) | (0.14, 0.60) |
| | Chromaticity difference | — | 0.00 | 0.02 | 0.05 | 0.08 |
| Type 2 | Peak wavelength | 517.5 nm | 515.1 nm | 510.9 nm | 506.4 nm | 502.9 nm |
| | Relative luminance | 1 | 0.95 | 0.79 | 0.53 | 0.27 |
| | CIE chromaticity coordinates | (0.17, 0.70) | (0.17, 0.70) | (0.15, 0.69) | (0.14, 0.66) | (0.14, 0.62) |
| | Chromaticity difference | — | 0.00 | 0.02 | 0.05 | 0.09 |

As described above, by changing the resonator structure of a device to vary the manner of superposition between the peak wavelength of an emission spectrum and the peak wavelength of a multiple interference spectrum, the changes in relative luminance and chromaticity depending on a viewing angle become different from each other. That is, by adjusting the manner of superposition of those peak wavelengths, the change in the light-emitting characteristics depending on a viewing angle can be controlled.

Here, description has been made by taking as an example the case in which the peak wavelength of the multiple interference spectrum is offset by +11.5 nm with respect to the peak wavelength of the emission spectrum. However, the amount of offset between the respective peak wavelengths is not particularly limited, and can be set to an arbitrary value as required. Further, the emission color is not particularly limited either, and the present invention is applicable to devices having any emission colors.

When lights emitted by a plurality of devices having different emission colors are mixed such that a white color as a synthetic color thereof is obtained, the chromaticity ($x_w$, $y_w$) and luminance $Y_w$ of the white light to be synthesized can be calculated as described below. Specifically, the chromaticity and the luminance can be calculated by using Equation 3 shown below where the chromaticity and luminance of emitted light are represented by $(x_i, y_i)$ and $Y_i$ (i=1, 2, . . . ), respectively.

$$x_w = \frac{x_1 S_1 + x_2 S_2 + \cdots + x_i S_i}{S_1 + S_2 + \cdots + S_i} \quad \text{(Equation 3)}$$

$$y_w = \frac{y_1 S_1 + y_2 S_2 + \cdots + y_i S_i}{S_1 + S_2 + \cdots + S_i} = \frac{Y_1 + Y_2 + \cdots + Y_i}{S_1 + S_2 + \cdots + S_i}$$

$$S_i = \frac{Y_i}{y_i}$$

$$Y_w = Y_1 + Y_2 + \cdots + Y_i$$

As described above, the chromaticity of a synthesized color are determined by a relationship between the chromaticity and brightness of lights of the devices to be mixed. For example, three colors, that is, a red color having chromaticity of (0.67, 0.33), a green color having chromaticity of (0.21, 0.71), and a blue color having chromaticity of (0.14, 0.08) at a viewing angle of 0° are mixed. Then, in order that a white color having chromaticity of (0.32, 0.33) may be obtained, the red, green, and blue colors need to be mixed at a luminance ratio of the red color, the green color, and the blue color of 3:6:1. The luminance ratio of the green color of the three colors is particularly high, which results from the fact that the y-coordinate of the chromaticity of the green color is relatively large.

In general, each of the x- and y-coordinates of the chromaticity of a white color is about 0.3. Accordingly, each of the equations for the chromaticity coordinates $x_w$ and $y_w$ in Equation 3 needs to be such that the ratio of a numerator to a denominator is approximately 1:3. The denominator in each of the both equations is the total sum of S values each obtained by dividing the brightness of each emission color by the y-coordinate of the chromaticity the color. In the red and blue colors each having a relatively small y-coordinate of the chromaticity, a large S value can be obtained without setting an especially high luminance. On the other hand, in the green color having a relatively large y-coordinate of the chromaticity, setting a high luminance corresponding to the y-coordinate of the chromaticity is necessary for maintaining a denominator to be about three times the numerator. The luminance ratio of the green color of the three colors needs to be set to be higher for these reasons.

Figure 5:
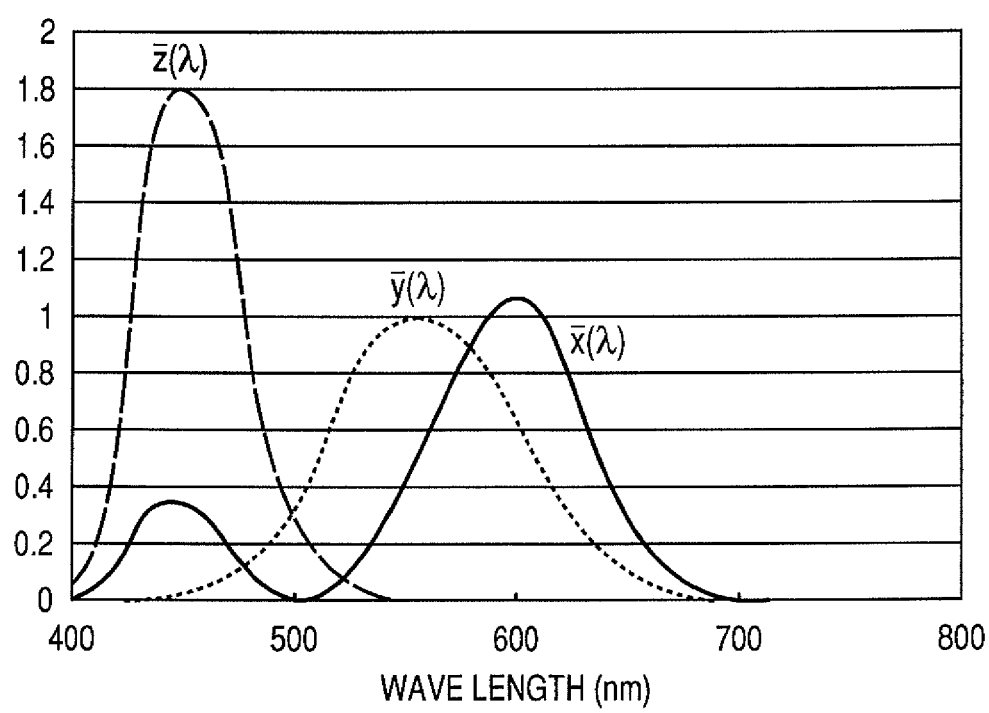
FIG. 5 is a graphical representation illustrating spectral tristimulus values.

The chromaticity coordinates are calculated as shown in Equation 6 by using tristimulus values X, Y, and Z determined by Equation 5 shown below by using each emission spectrum $P(\lambda)$ and spectral tristimulus values of $$\bar{x}(\lambda), \bar{y}(\lambda), \bar{z}(\lambda)$$

shown in FIG. 5.

$$X = k \int_s P(\lambda)\bar{x}(\lambda)d\lambda \quad \text{(Equation 5)}$$

$$Y = k \int_s P(\lambda)\bar{y}(\lambda)d\lambda$$

$$Z = k \int_s P(\lambda)\bar{z}(\lambda)d\lambda$$

-continued $$x = \frac{X}{X+Y+Z}, y = \frac{Y}{X+Y+Z} \quad \text{(Equation 65)}$$

It can be seen from the above equations that the y-coordinate of the chromaticity is determined by the manner of superposition of the emission spectrum $P(\lambda)$ and the spectral tristimulus value $$\bar{y}(\lambda).$$

Meanwhile, the spectral tristimulus value (Equation 7) is equal to a standard luminous efficiency $V(\lambda)$, so that an emission color having a large y-coordinate of the chromaticity can be regarded as having a high visual sensitivity. Accordingly, when a white color is to be obtained by mixing lights emitted from a plurality of devices of different emission colors, the emission luminance of the device having a larger y-coordinate of the chromaticity, that is, having a higher visual sensitivity needs to be set to be higher than that of the device of the other emission color.

Here, description has been made by taking, as an example, a case where a white color is obtained by mixing three colors, that is, red, green, and blue colors. However, the number of emission colors to be mixed is not particularly limited, and the above description also applies to the case where a white color is obtained by mixing two emission colors such as red and cyan colors or blue and yellow colors.

The amount of a variation in the light-emitting characteristics depending on a viewing angle for each emission color will be considered. For example, in the case of comparison between three color light-emitting devices, that is, red-, green-, and blue-light-emitting devices, the amounts of variation in the characteristics depending on the viewing angle are in the relationship of blue-light-emitting device>green-light-emitting device>red-light-emitting device. Table 4 shows a change in peak wavelength depending on a viewing angle of each of three devices showing red, green, and blue emission colors in which the peak wavelength of an emission spectrum and the peak wavelength of a multiple interference spectrum are caused to coincide with each other.

TABLE 4

Change in peak wavelength depending on viewing angle

| | Viewing angle | | | | |
|---|---|---|---|---|---|
| | 0° | 15° | 30° | 45° | 60° |
| Red | 609 nm | 608 nm | 603 nm | 601 nm | 601 nm |
| Green | 527 nm | 525 nm | 522 nm | 519 nm | 518 nm |
| Blue | 459 nm | 458 nm | 455 nm | 451 nm | 448 nm |

When a white color is obtained by mixing lights emitted from a plurality of devices of different emission colors, the ratio of an emission luminance necessary for a device showing an emission color having a short wavelength such as a blue color is low. Therefore, a device that emits light having a short wavelength shows relatively large changes in light-emitting characteristics depending on a viewing angle, but its luminance is relatively low, so that the device has a small influence on a change in characteristics depending on a viewing angle at the time of displaying a white color as a synthetic color. On the other hand, in a device that emits light having a peak wavelength within the region of 500 to 550 nm such as a green color, the shorter wavelength side of the emission spectrum is superposed on a region where the refractive index abruptly changes with respect to the wavelength, so that the device easily causes changes in light-emitting characteristics depending on the viewing angle. In addition, such wavelength region (500 to 550 nm) corresponds to a region where the visual sensitivity is relatively high, and, for the foregoing reason, when a plurality of emission colors are mixed to give a white color as a synthesis color, these devices which emit light with a high visual sensitivity need to be caused to emit light more brightly. Therefore, as one cause for a change in characteristics depending on a viewing angle of the resultant white color as a synthesis color, there is included a change in characteristics depending on a viewing angle of a device that emits light with a high visual sensitivity.

In the present invention, attention has been paid to a change in characteristics depending on a viewing angle of a device that emits light having a relatively highest visual sensitivity as a cause for the occurrence of the color shift of a display image. That is, the present invention aims to adjust the viewing angle of the device that emits light having the relatively highest visual sensitivity to thereby suppress the color shift due to a viewing angle of an image reproduced on a display apparatus.

Specifically, attention has been paid to the fact that the change in characteristics depending on a viewing angle can be adjusted by the superposition of the peak wavelength of an emission spectrum and the peak wavelength of a multiple interference spectrum. Thereby, the viewing angle characteristic of the device that emits light having the relatively highest visual sensitivity, thus realizing a display apparatus capable of displaying a good image even when the viewing angle varies.

For example, a display apparatus is considered in which the peak wavelength of an emission spectrum and the peak wavelength of a multiple interference spectrum are caused to coincide with each other for each of three colors, that is, red, green, and blue colors. At this time, the three color light-emitting devices, that is, a red-light-emitting device, a green-light-emitting device, and a blue-light-emitting device show a red color with chromaticity coordinates (0.65, 0.35), a green color with chromaticity coordinates (0.14, 0.68), and a blue color with chromaticity coordinates (0.14, 0.08) at a viewing angle of 0°, respectively. Those three colors, that is, the red, green, and blue colors are mixed at a luminance ratio of red color: green color: blue color=3.7:5.4:0.9, whereby a white color with chromaticity coordinates (0.32, 0.33) was displayed.

Figure 6:
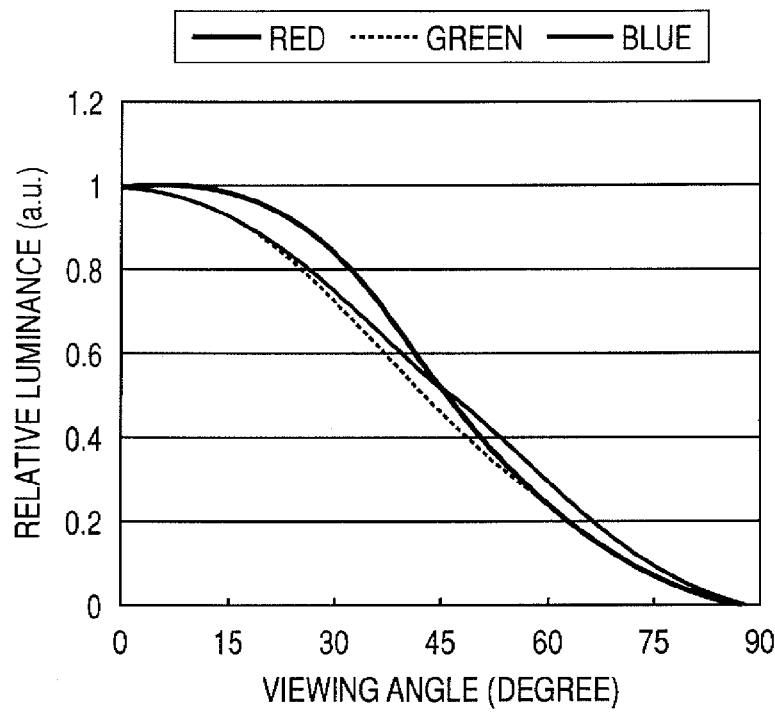
FIG. 6 is a graphical representation illustrating a change in luminance of each of organic red-, green-, and blue-light-emitting devices depending on a viewing angle.

FIG. 6 shows relative changes in luminance depending on a viewing angle for respective emission colors of the above display apparatus when the luminance of each color at a viewing angle of 0° is defined as 1. At this time, the difference in relative luminances within the viewing angle range of 0° to 60° has the maximum of 10.8% between the red color and the green color at a viewing angle of 30°, and the chromaticity difference at the time of white color display is 0.026.

Figure 7:
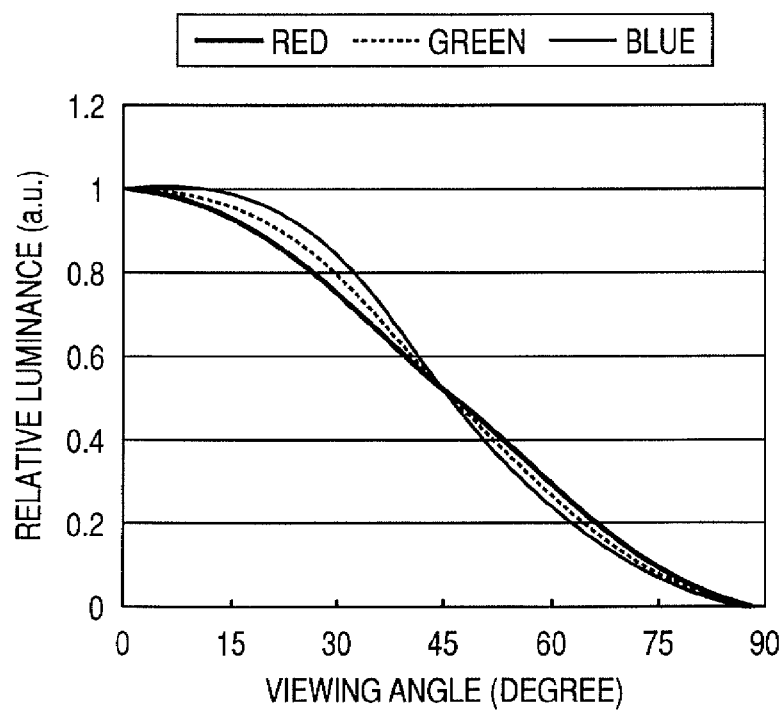
FIG. 7 is a graphical representation illustrating a change in luminance of each of organic red-, green-, and blue-light-emitting devices depending on a viewing angle.

Subsequently, only for the device that emits green light, the superposition is adjusted such that the peak wavelength of the multiple interference spectrum is offset by +11.5 nm with respect to the peak wavelength of the emission spectrum. The device emits light of a green color with chromaticity coordinates (0.17, 0.70) at a viewing angle of 0°. A display apparatus is constituted by combining the above device that emits green light with the device showing a red color with chromaticity coordinates (0.65, 0.35) and the device showing a blue color with chromaticity coordinates (0.14, 0.08) described in the foregoing example, and the red, green, and blue colors are mixed at a luminance ratio of 3.7:5.5:1.0, whereby a white color is displayed. FIG. 7 shows relative changes in luminance depending on a viewing angle for respective emission colors of the above display apparatus when the luminance of each color at a viewing angle of 0° is defined as 1. In this case, the difference in relative luminance within the viewing angle range of 0° to 60° is such that the difference between the red color and the green color at a viewing angle of 30° is 4.3%, and the chromaticity difference at the time of white color display in that state is 0.017. In general, a chromaticity difference of more than 0.02 is recognized as a difference in tint. In view of the foregoing, a display apparatus in which the superposition of the peak wavelength of an emission spectrum and the peak wavelength of a multiple interference spectrum is adjusted for a device that emits green light and the chromaticity difference is reduced to 0.02 or less can be said to be a display apparatus showing a small change in tint depending on a viewing angle. Further, when the difference in relative luminance within the viewing angle range of 0° to 60° is more than 10%, the chromaticity difference will be more than 0.02. From this fact, a display apparatus in which a maximum difference in luminance changes of the respective emission colors depending on a viewing angle is 10% or less within a viewing angle range of 0° or more and 60° or less can be said to be a display apparatus showing a small change in tint depending on a viewing angle.

When the power consumption of a display apparatus is considered, the higher the efficiency of each device that constitutes the display apparatus, the more the power consumption can be reduced. As a means for realizing a high-efficiency device, there is included a method that involves causing the peak wavelength of an emission spectrum and the peak wavelength of a multiple interference spectrum to coincide with each other. This method allows the realization of a highly efficient device which is high in emitted light extraction efficiency. In view of the foregoing, in a display apparatus of the present invention, the superposition of the peak wavelength of an emission spectrum and the peak wavelength of a multiple interference spectrum is adjusted, and the both peak wavelengths are caused to be offset with respect to each other only for a device that emits light with the relatively highest visual sensitivity. The both peak wavelengths are caused to coincide with each other for the devices showing the other emission colors. Thereby, in the device that emits light having the relatively highest visual sensitivity, the emission efficiency is reduced as compared to that in the case where the peak wavelengths are caused to coincide with each other. However, the devices showing the other emission colors become high-efficiency devices because the peak wavelengths thereof are caused to coincide with each other. As a result, there can be provided a display apparatus which causes a small change in characteristics depending on a viewing angle, has good viewing angle visibility, and has a low power consumption.

Figure 2:
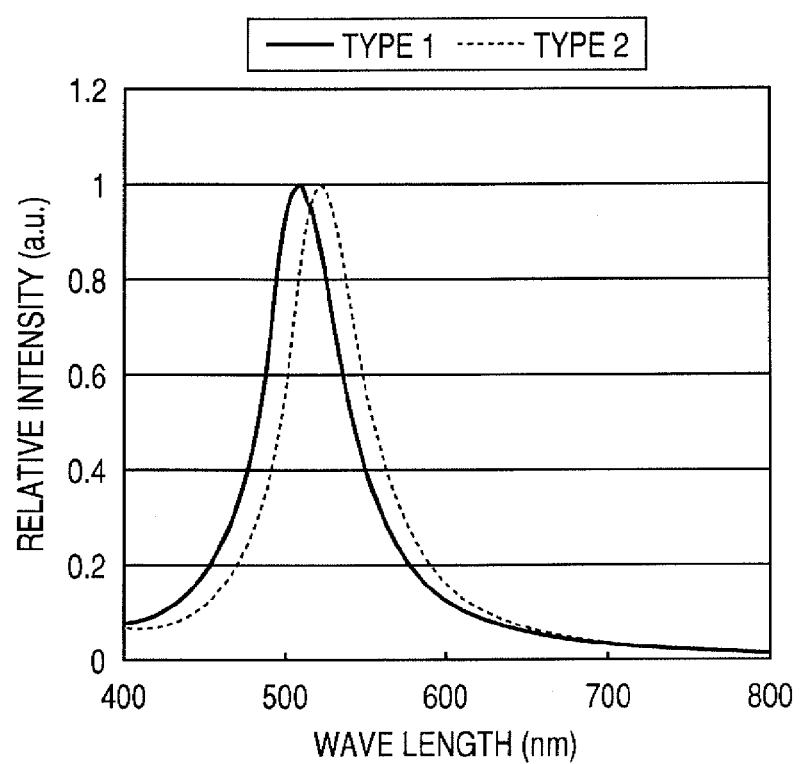
FIG. 2 is a graphical representation illustrating a multiple interference spectra of Type 1 organic light-emitting device and Type 2 organic light-emitting device.

In addition, light emitted from the device can be extracted from either the substrate 1 side or the cathode 7 side in FIG. 2. However, in consideration of an active matrix driving display apparatus, from the viewpoint of the securement of an aperture ratio, a display apparatus of a so-called top emission configuration in which light is extracted from the cathode 7 side is advantageous.

Figure 8:
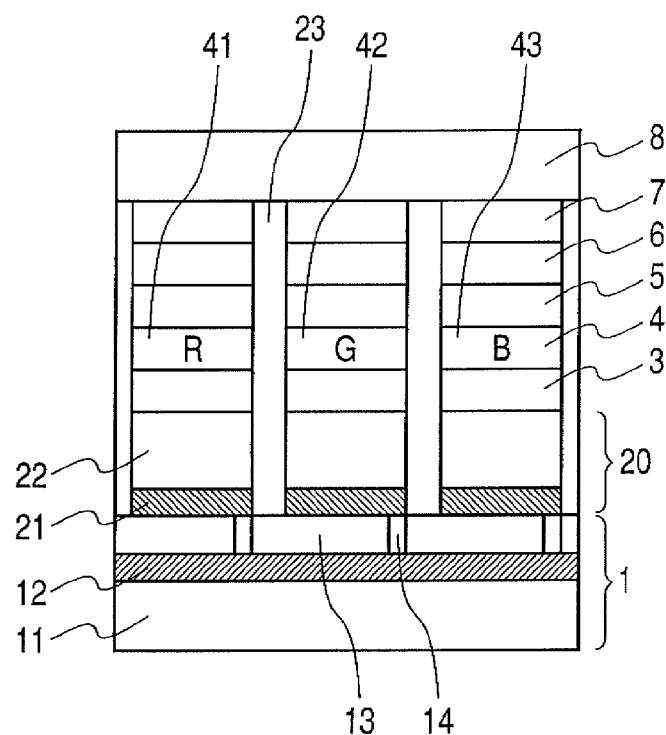
FIG. 8 is a schematic cross-sectional view illustrating a top emission type active matrix display apparatus.

FIG. 8 is a schematic cross-sectional view showing a top emission type active matrix display apparatus. The substrate 1 in FIG. 8 is constituted of a support 11, a TFT drive circuit 12, and a leveling film 13. The support used in the present invention is not particularly limited, and, for example, a support made of a metal, ceramic, glass, or quartz is used. Alternatively, a flexible display apparatus obtained by forming the TFT drive circuit on a flexible sheet such as a plastic sheet is also available. Anodes 20 are formed on the substrate. Each anode 20 is constituted of a reflective metal 21 and a transparent conductive film 22, and the connection between each anode 20 and the TFT drive circuit 12 is established through a contact hole 14. The reflective metal 21 is desirably such that the reflectance at an interface with the transparent conductive film 22 is at least 50%, preferably 80% or more. That is, the reflective surface that is closer to the anode than a light-emitting layer in this embodiment refers to the interface between the reflective metal 21 and the transparent conductive film 22. The material that constitutes the reflective metal 21 is not particularly limited, and, for example, a metal such as silver, aluminum, or chromium, or an alloy thereof is used. As the transparent conductive film 22, there can be used an oxide conductive film, specifically a compound (ITO) film containing indium oxide and tin oxide, a compound (IZO) film containing indium oxide and zinc oxide. Incidentally, the term "transparent" as employed herein refers to a state where the film has a transmittance for visible light of 80 to 100%. More specifically, the transparent conductive film 22 has an extinction coefficient K of preferably 0.05 or less, more preferably 0.01 or less from the viewpoint of the suppression of the attenuation of visible light due to multiple reflection. The thickness of the transparent conductive film 22 in the present invention, which depends on the refractive index thereof and the emission color of the display apparatus, is desirably set such that the thickness of the hole-transporting layer 3 falls within the range of 10 to 200 nm, preferably 10 to 100 nm. This is because driving the display apparatus at a low voltage is advantageous from the viewpoint of the power consumption. The anodes 20 are patterned for the respective devices, and are isolated from each other by device isolation films 23. Incidentally, the device isolation film 23 is preferably formed of a member capable of absorbing ambient light such as a resin containing carbon black in order that the reflection of ambient light between devices may be prevented, thereby realizing a display apparatus having a higher contrast.

Each of organic compounds to be used in the hole-transporting layer 3, the light-emitting layer 4, the electron-transporting layer 5, and the electron injection layer 6 may be composed of a low-molecular weight material, a polymer material, or both the low-molecular weight material and the polymer material, and is not particularly limited. Any conventionally known material can be used as needed.

Hereinafter, examples of those compounds are given.

The material for the hole-transporting layer 3 preferably has a mobility which facilitates the injection of holes from the anode 20 and which is excellent in transportation of the injected holes to the light-emitting layer 4. In addition, a hole injection layer may be interposed between the anode 20 and the hole-transporting layer 3 as needed. Examples of the low-molecular weight material and the polymer material having hole-injecting/transporting performance include, but of course not limited to, a triarylamine derivative, a phenylene-diamine derivative, a triazole derivative, an oxadiazole derivative, an imidazole derivative, a pyrazoline derivative, and a pyrazolone derivative. Further, there are also included an oxazole derivative, a fluorenone derivative, a hydrazone derivative, a stilbene derivative, a phthalocyanine derivative, a porphyrin derivative, poly(vinylcarbazole), poly(silylene), poly(thiophene), and other conductive polymers. Hereinafter, a part of specific examples of the materials is shown.

Low molecular hole-injecting/transporting material

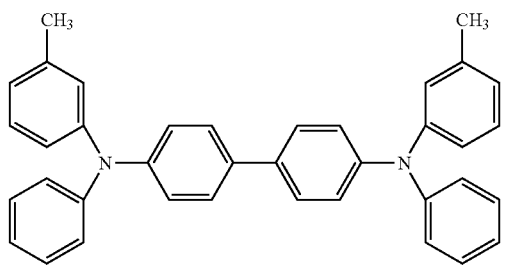

TPD

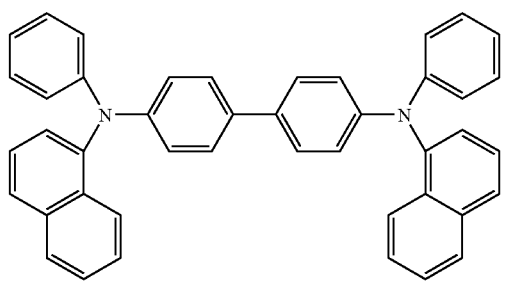

α-NPD

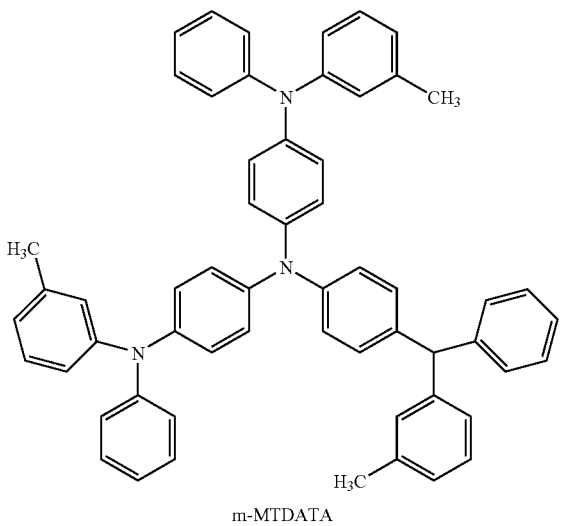

m-MTDATA

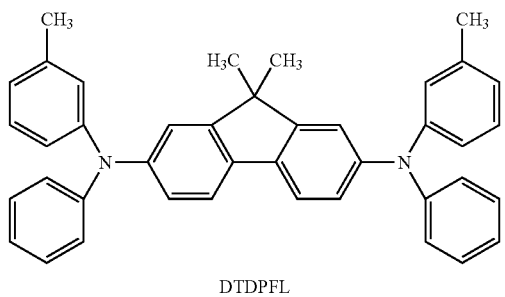

DTDPFL

Polymer hole-transporting material
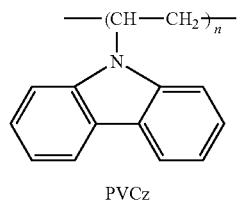
PVCz
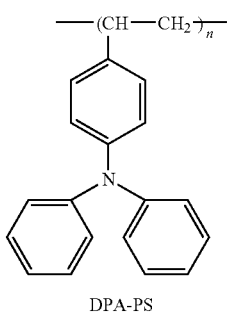
DPA-PS
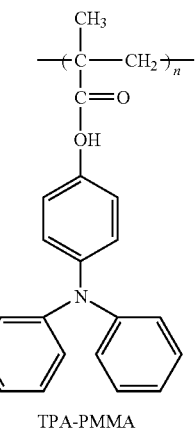
TPA-PMMA
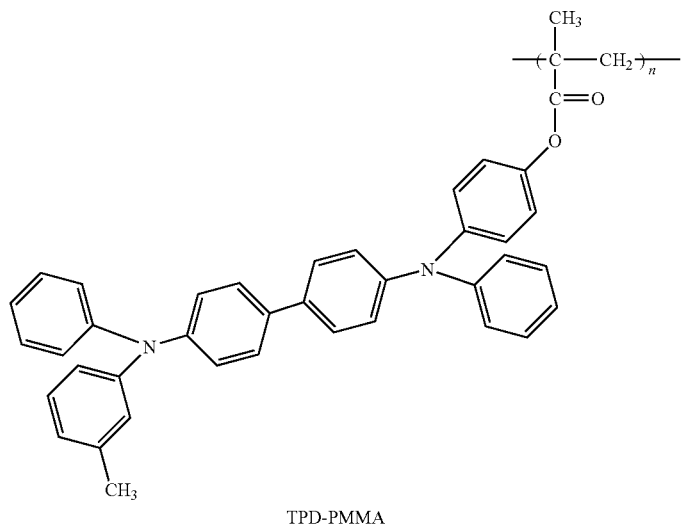
TPD-PMMA
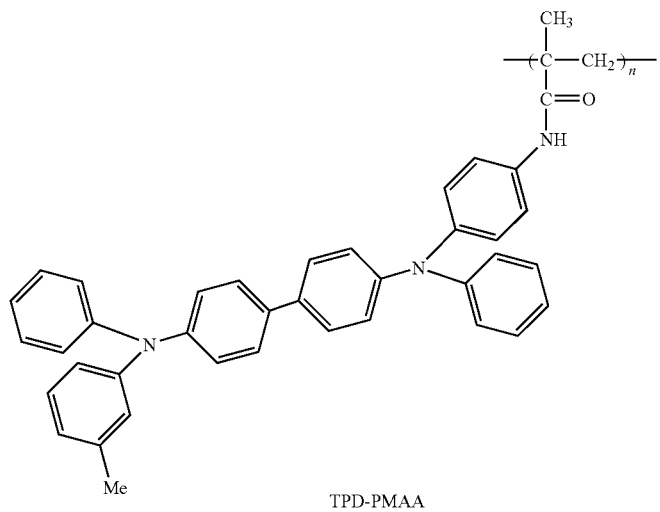
TPD-PMAA
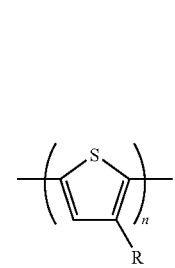
R:C6H13, C8H17, C12H25
Poly thiophene
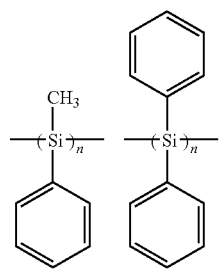
Polysilane -continued

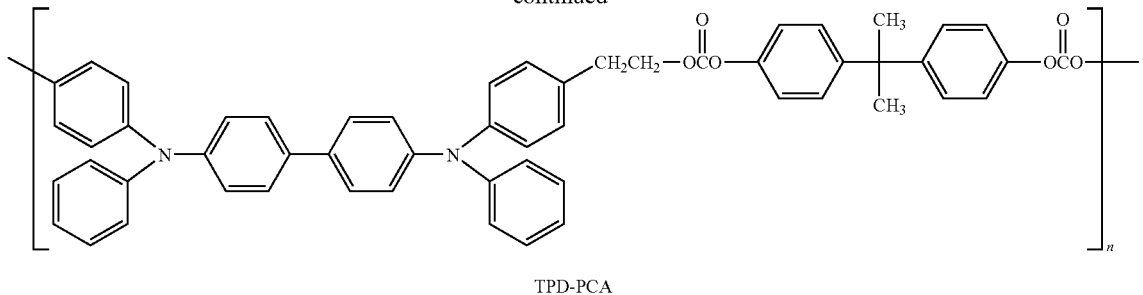

TPD-PCA

As the material for the light-emitting layer 4, a fluorescent dye or phosphorescent material having a high emission efficiency is used. Hereinafter, a part of specific examples of the dye or the material are shown.

ing injected electrons to the light-emitting layer 4, and is selected in consideration of, for example, a balance with the carrier mobility of the hole-transporting layer 3. Examples of a material having electron-injecting/transporting perfor-

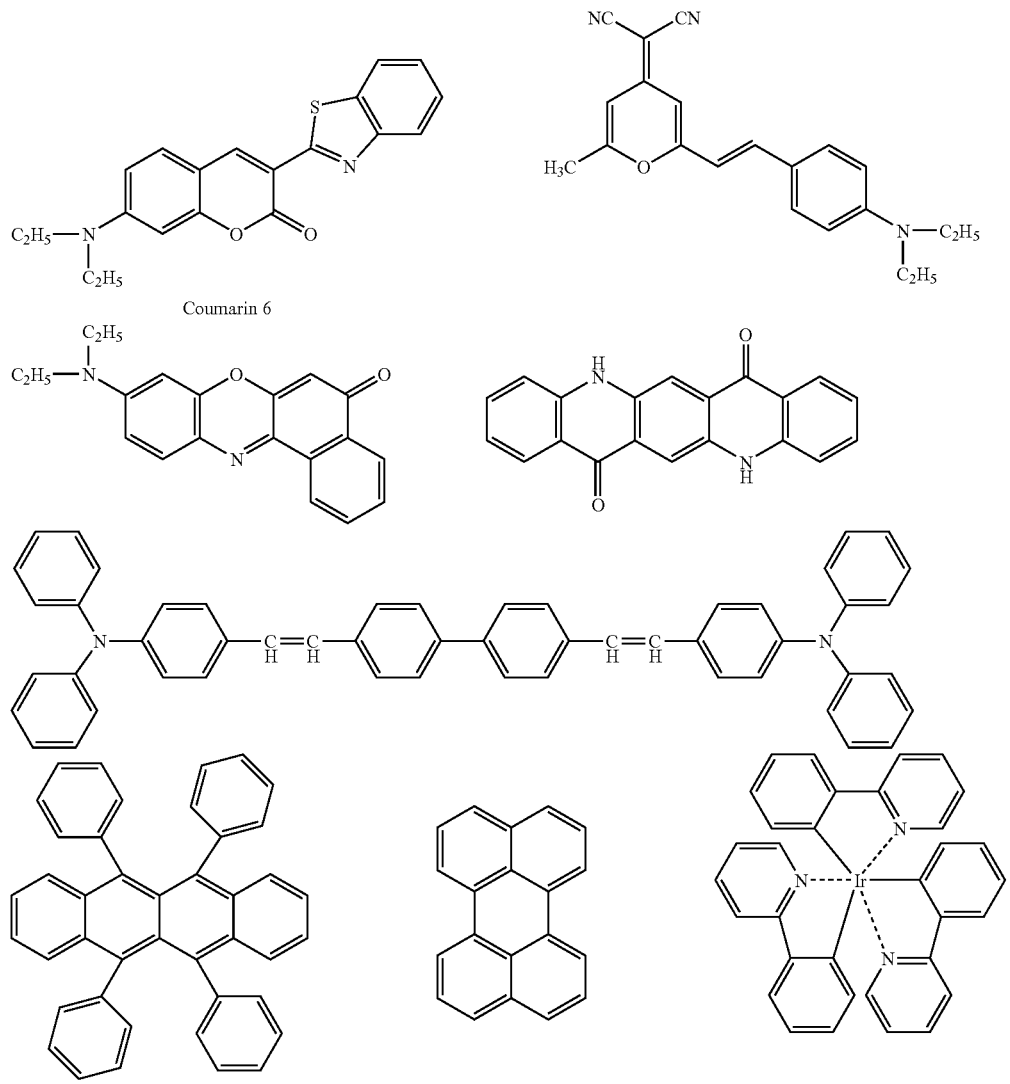

Coumarin 6

The material for the electron-transporting layer 5 can be arbitrarily selected from those having a function of transportmance include, but of course not limited to, an oxadiazole derivative, an oxazole derivative, a thiazole derivative, a thiadiazole derivative, a pyrazine derivative, a triazole derivative, a triazine derivative, a perylene derivative, and a quinoline derivative. Further, there are also included a quinoxaline derivative, a fluorenone derivative, an anthrone derivative, a phenanthroline derivative, and an organometallic complex. Hereinafter, a part of specific examples of the material is shown.

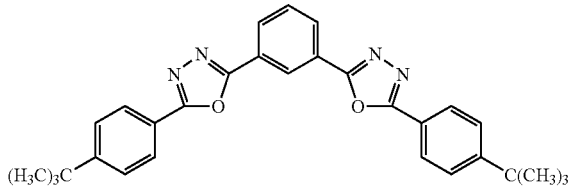

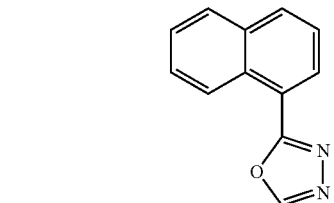

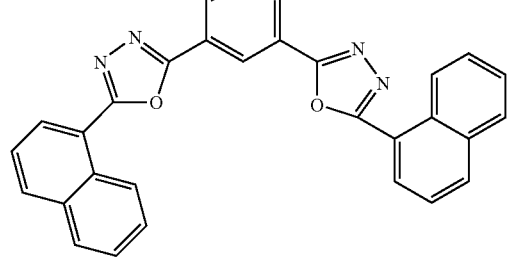

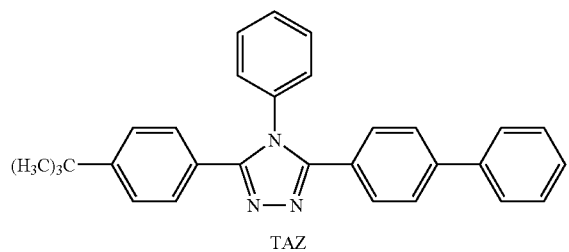

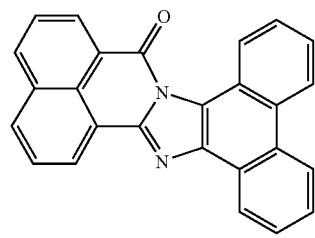

TAZ

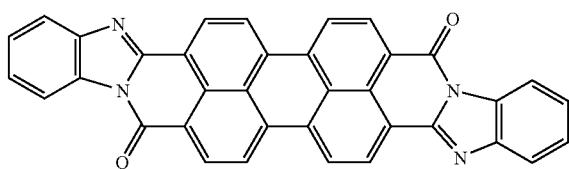

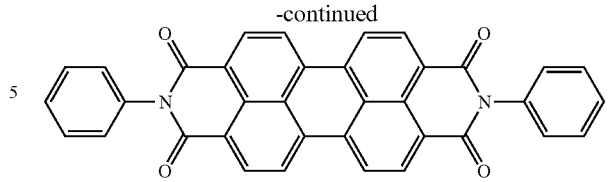

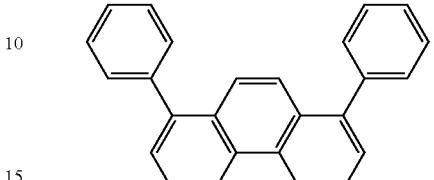

Bphen

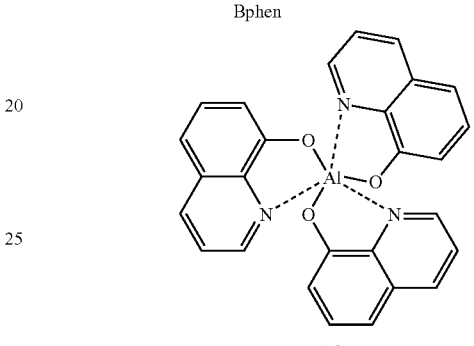

Alq3

As the electron injection layer 6, by incorporating into the above-mentioned electron-transporting material an alkali metal, an alkali earth metal, or a compound thereof in an amount of 0.1 to several tens %, electron injecting property can be imparted thereto. The electron injection layer 6 is not an indispensable layer but is preferably provided in a thickness of about 10 to 100 nm for securing good electron-injecting property in consideration of damage to be received at the time of the subsequent formation step of the cathode 7.

The organic compound layer of the present invention can be formed as a thin film generally with vapor deposition method, ion plating method, sputtering, plasma CVD, or by using a well-known coating method of applying such organic compound dissolved in a suitable solvent, such as spin coating, dipping, casting, LB method, or ink jet method. Particularly, when the film is formed with the coating method, the film can be formed by additionally using a suitable binder resin. The above described binder resin can be selected from a wide range of binding resins, and includes, for instance, polyvinylcarbazole resin, polycarbonate resin, polyester resin, polyarylate resin, polystyrene resin, ABS resin, polybutadiene resin, polyurethane resin, acrylic resin, methacrylic resin, and butyral resin. Further, there are also included polyvinylacetal resin, polyamide resin, polyimide resin, polyethylene resin, polyether sulfonic resin, diallylphthalate resin, phenolic resin, epoxy resin, silicone resin, polysulfonic resin and urea resin. However, the present invention is not limited to them. In addition, the binder resin may be singly used, or be used in combination as a copolymer. Furthermore, an additive such as a well-known plasticizer, antioxidant, and ultraviolet absorber, as needed.

As the cathode 7, there are used a translucent electrode formed of a thin film of a metal such as silver or aluminum or an alloy thereof, or a combination of such a translucent electrode and an oxide conductive film such as of ITO or IZO. The combination of the electron-transporting layer 5 and the electron-injecting layer 6 is desirably selected in such an appropriate manner that good electron injection property can be obtained. The cathodes 7 of the respective light-emitting devices may be constituted of a common material, and may have a common thickness. Alternatively, at least one of the thickness and material of the cathode 7 may be selected individually for each light-emitting device. In addition, the cathode 7 may be formed by any method, and can be formed by, for example, sputtering or vapor deposition.

The protective layer 8 is provided for preventing contact with oxygen, moisture, or the like. Examples of the protective layer 8 include a metal nitride film such as of silicon nitride or silicon oxynitride; a metal oxide film such as of tantalum oxide; a diamond thin film; a polymer film such as fluororesin, polyparaxylene, polyethylene, silicone resin, polystyrene resin, or the like; and a photocurable resin. Alternatively, the element itself may be covered with glass, a gas impermeable film, a metal, or the like, and packaged with an appropriate encapsulant resin. In addition, a desiccant may be incorporated into the protective layer 8 for improving moisture resistance.

Figure 9:
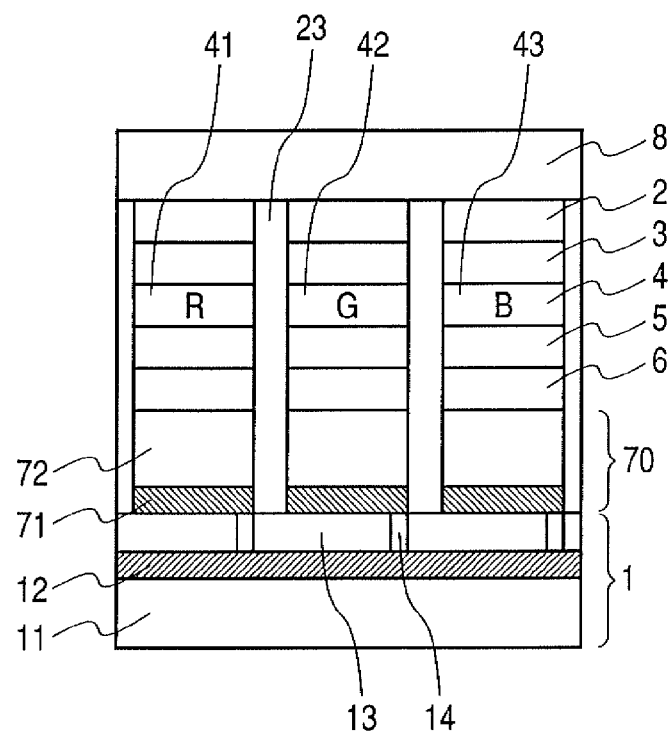
FIG. 9 is a schematic cross-sectional view illustrating a top emission type active matrix display apparatus having a constitution reverse to that shown in FIG. 8.

In the above-mentioned embodiment, the constitution in which the anode 20 is provided on the TFT drive circuit 12 has been described. However, a reverse constitution such as illustrated in FIG. 9 may also be adopted. That is, a reflective electrode 71, a transparent conductive film 72, an electron injection layer 6, an electron-transporting layer 5, a light-emitting layer 4, a hole-transporting layer 3, a translucent anode 2, and a protective layer 8 may be stacked on a substrate 1 in the mentioned order. In this case, the reflective surface which is closer to the cathode than the light-emitting layer 4 is refers to an interface between the reflective electrode 71 and the transparent conductive film 72, and the reflective surface which is closer to the anode than the light-emitting layer 4 is refers to an interface between the hole-transporting layer 3 and the translucent anode 2.

EXAMPLES

Hereinafter, examples of the present invention will be described in more detail. However, the present invention is not limited to those examples.

Example 1

A display apparatus having a structure shown in FIG. 8 and composed of three colors, that is, a red color, a green color, and a blue color, was produced by the following method.

A TFT drive circuit 12 composed of low temperature polysilicon was formed on a glass substrate 11 as a support member, and a leveling layer 13 composed of an acrylic resin was formed thereon to prepare a substrate 1. On the substrate, a film of silver alloy (AgCuNd) was formed in a thickness of about 100 nm by sputtering, followed by patterning, thereby preparing a reflective layer 21. Further, a film of IZO was formed in a thickness of 10 nm by sputtering, followed by patterning, thereby preparing a transparent conductive film 22. Thus, the reflecting electrode 20 was formed. Further, a device isolation film 23 was formed of an acrylic resin, whereby the substrate with the anode was prepared. The substrate with anode was ultrasonically cleaned with isopropyl alcohol (IPA) and was then washed with boiling before being dried. Further, the dried substrate was subjected to UV/ozone cleaning, and then organic compound materials were formed into films by vacuum deposition.

Compound [I] represented by the below-mentioned structural formula was formed into a film in a thickness of 15 nm for all the light-emitting devices to prepare a common hole-transporting layer 3. At this time, the degree of vacuum was $1 \times 10^{-4}$ Pa and the deposition rate was 0.2 nm/sec.

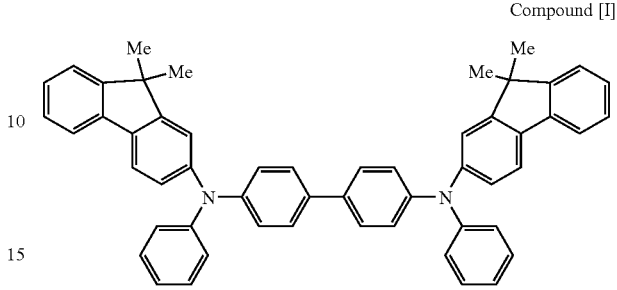

Compound [I]

As a light-emitting layer 4, light-emitting layers 41, 42, and 43 for red, green, and blue colors were formed, respectively, by using a shadow mask. For the red light-emitting layer 41, Alq3 as a host and a light-emitting compound DCM [4-(dicyanomethylene)-2-methyl-6-(p-dimethylaminostyryl)-4H-pyran] were co-deposited (weight ratio of 99:1) to form a film having a thickness of 30 nm. For the green light-emitting layer 42, Alq3 as a host and the light-emitting compound Coumarin 6 mentioned above were co-deposited (weight ratio of 99:1) to form a film having a thickness of 42 nm. For the blue light-emitting layer, Compound [II] shown below as a host and a light-emitting compound [III] shown below were co-deposited (weight ratio of 80:20) to form a film having a thickness of 10 nm. The film forming conditions were such that the degree of vacuum during the vacuum deposition was $1 \times 10^{-4}$ Pa and the film forming rate was 0.2 nm/sec.

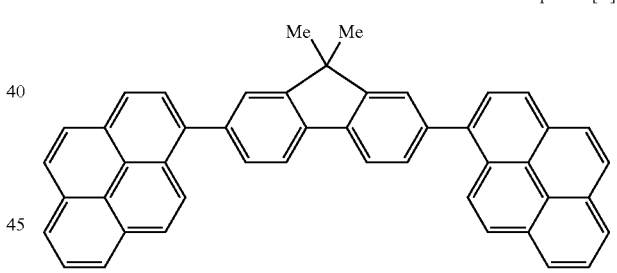

Compound [II]

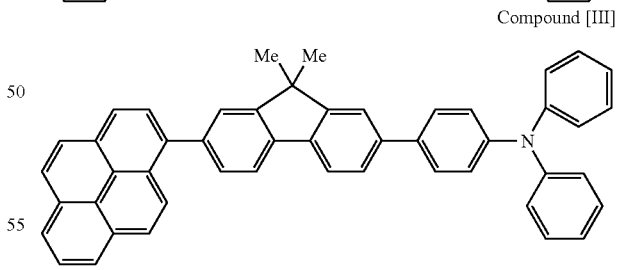

Compound [III]

As a common electron-transporting layer 5, bathophenanthroline (Bphen) was vacuum deposited to form a film having a thickness of 10 nm. The deposition conditions were such that the degree of vacuum was $1 \times 10^{-4}$ Pa and the film forming rate was 0.2 nm/sec.

Further, as a common electron injection layer 6, Bphen and $Cs_2CO_3$ were co-deposited (weight ratio of 90:10) to form a film having a thickness of 52 nm, 14 nm, and 22 nm at each of the red, green, and blue light portions, respectively. The deposition conditions were such that the degree of vacuum was $3\times10^{-4}$ Pa and the film forming rate was 0.2 nm/sec.

As a cathode 7, silver (Ag) was formed into a film having a thickness of 15 nm. The degree of vacuum at the time of vacuum deposition was $1\times10^{-4}$ Pa and the film forming rate was 0.2 nm/sec. Table 5 shows collectively the film thickness constitution of the red-, green-, and blue-light-emitting devices.

The substrate having the layers up to and including the cathode 7 formed thereon was transferred to a sputtering apparatus without breaking the vacuum, and silicon oxynitride was formed into a film having a thickness of 1,500 nm as a protective layer 8, whereby a display apparatus was obtained Table 6 shows a relationship between the peak wavelength of an emission spectrum and the peak wavelength of a multiple interference spectrum in each of the red-, green-, and blue-light-emitting devices in this case. As can be seen from Table 6, in this example, for the green-light-emitting device having the highest visual sensitivity of the light-emitting devices of the three colors of red, green, and blue, the peak wavelength of the multiple interference spectrum was set to be offset by +11 nm with respect to the peak wavelength of the emission spectrum. In addition, the peak wavelength of the emission spectrum and the peak wavelength of the multiple interference spectrum were set to coincide with each other for each of the red- and blue-light-emitting devices. Thus, in the green-light-emitting device, the change in the light-emitting characteristics depending on the viewing angle is suppressed as compared to those in the case where the peak wavelengths are caused to coincide with each other.

The display apparatus thus obtained was evaluated for its characteristics (power consumption and change in chromaticity of a white color depending on a viewing angle). Table 7 shows the results.

Comparative Example 1

In this comparative example, a display apparatus was produced by following the same procedure as in Example 1 with the exception that the thickness of an organic compound layer of a green-light-emitting device was adjusted such that the peak wavelength of an emission spectrum and the peak wavelength of a multiple interference spectrum coincided with each other also for the green-light-emitting device. That is, this comparative example is directed to a display apparatus in which the peak wavelength of an emission spectrum and the peak wavelength of a multiple interference spectrum are caused to coincide with each other for all the red-, green-, and blue-light-emitting devices. Table 5 shows collectively the thicknesses of the layers which constitute each of the red-, green-, and blue-light-emitting devices at this time. In addition, Table 6 shows a relationship between the peak wavelength of the emission spectrum and the peak wavelength of the multiple interference spectrum for each of the red-, green-, and blue-light-emitting devices.

The display apparatus thus obtained was evaluated for its characteristics (power consumption and change in chromaticity of a white color depending on a viewing angle). Table 7 shows the results.

Comparative Example 2

In this comparative example, a display apparatus formed of light-emitting devices of three emission colors of red, green, and blue was produced by following the same procedure as in Example 1 with the exception that the peak wavelength of an emission spectrum and the peak wavelength of a multiple interference spectrum were set to be offset with respect to each other for the red-light-emitting device having a visual sensitivity which was not the highest and the peak wavelengths were caused to coincide with each other for each of the green- and blue-light-emitting devices as is the case with Comparative Example 1. The amount of the offset between the peak wavelengths of the red-light-emitting device was such that the change in chromaticity at the time of white color display within the viewing angle range of 0° to 60° was substantially identical to that in Example 1. Table 5 shows collectively the thicknesses of the layers which constitute each of the red-, green-, and blue-light-emitting devices at this time. In addition, Table 6 shows a relationship between the peak wavelength of the emission spectrum and the peak wavelength of the multiple interference spectrum in each of the red-, green-, and blue-light-emitting devices.

The display apparatus thus obtained was evaluated for its characteristics (power consumption and change in chromaticity of a white color depending on a viewing angle). Table 7 shows the results.

Comparative Example 3

In this comparative example, a display apparatus formed of light-emitting devices of three emission colors of red, green, and blue was produced by following the same procedure as in Example 1 with the exception that the peak wavelength of an emission spectrum and the peak wavelength of a multiple interference spectrum were caused to coincide with each other for the green-light-emitting device with the highest visual sensitivity and the peak wavelengths were set to be offset with respect to each other for each of the red- and blue-light-emitting devices. The amount of the offset between the peak wavelengths of the red- and blue-light-emitting devices was such that the change in chromaticity at the time of white color display within the viewing angle range of 0° to 60° was substantially identical to that in Example 1. Table 5 shows collectively the thickness of the layers which constitute each of the red-, green-, and blue-light-emitting devices at this time. In addition, Table 6 shows a relationship between the peak wavelength of the emission spectrum and the peak wavelength of the multiple interference spectrum in each of the red-, green-, and blue-light-emitting devices.

The display apparatus thus obtained was evaluated for its characteristics (power consumption and change in chromaticity of a white color depending on a viewing angle). Table 7 shows the results.

Comparative Example 4

In this comparative example, a display apparatus formed of light-emitting devices of three emission colors of red, green, and blue was produced by following the same procedure as in Example 1 with the exception that the peak wavelength of an emission spectrum and the peak wavelength of a multiple interference spectrum were set to be offset with respect to each other for the light-emitting devices of the all emission colors. Table 5 shows collectively the thicknesses of the layers which constitute each of the red-, green-, and blue-light-emitting devices at this time. In addition, Table 6 shows a relationship between the peak wavelength of the emission spectrum and the peak wavelength of the multiple interference spectrum in each of the red-, green-, and blue-light-emitting devices.

The display apparatus thus obtained was evaluated for its characteristics (power consumption and change in chromaticity of a white color depending on a viewing angle). Table 7 shows the results.

TABLE 5

Film thickness constitutions of organic EL devices

|  |  | Red | Green | Blue |
|---|---|---|---|---|
| Ex. 1 | Cathode |  | 15 nm |  |
|  | Electron injection layer | 52 nm | 14 nm | 22 nm |
|  | Electron-transporting layer |  | 10 nm |  |
|  | Light-emitting layer | 30 nm | 42 nm | 10 nm |
|  | Hole-transporting layer |  | 15 nm |  |
|  | Transparent conductive film |  | 10 nm |  |
|  | Reflective metal |  | 100 nm |  |
| Comp. Ex. 1 | Cathode |  | 15 nm |  |
|  | Electron injection layer | 52 nm | 28 nm | 22 nm |
|  | Electron-transporting layer |  | 10 nm |  |
|  | Light-emitting layer | 30 nm | 24 nm | 10 nm |
|  | Hole-transporting layer |  | 15 nm |  |
|  | Transparent conductive film |  | 10 nm |  |
|  | Reflective metal |  | 100 nm |  |
| Comp. Ex. 2 | Cathode |  | 15 nm |  |
|  | Electron injection layer | 62 nm | 28 nm | 22 nm |
|  | Electron-transporting layer |  | 10 nm |  |
|  | Light-emitting layer | 30 nm | 24 nm | 10 nm |
|  | Hole-transporting layer | 19 nm | 15 nm | 15 nm |
|  | Transparent conductive film |  | 10 nm |  |
|  | Reflective metal |  | 100 nm |  |
| Comp. Ex. 3 | Cathode |  | 15 nm |  |
|  | Electron injection layer | 57 nm | 28 nm | 24 nm |
|  | Electron-transporting layer |  | 10 nm |  |
|  | Light-emitting layer | 33 nm | 24 nm | 11 nm |
|  | Hole-transporting layer | 17 nm | 15 nm | 17 nm |
|  | Transparent conductive film |  | 10 nm |  |
|  | Reflective metal |  | 100 nm |  |
| Comp. Ex. 4 | Cathode |  | 15 nm |  |
|  | Electron injection layer | 56 nm | 14 nm | 24 nm |
|  | Electron-transporting layer |  | 10 nm |  |
|  | Light-emitting layer | 34 nm | 44 nm | 11 nm |
|  | Hole-transporting layer | 10 nm | 10 nm | 17 nm |
|  | Transparent conductive film |  | 10 nm |  |
|  | Reflective metal |  | 100 nm |  |

TABLE 6

Relationship between internal emission spectrum peak and multiple interference spectrum peak

|  |  | Red | Green | Blue |
|---|---|---|---|---|
| Ex. 1 | Internal emission spectrum peak | 610 nm | 510 nm | 460 nm |
|  | Multiple interference spectrum peak | 610 nm | 521 nm | 460 nm |
|  | Peak offset amount | 0 nm | +11 nm | 0 nm |
| Comp. Ex. 1 | Internal emission spectrum peak | 610 nm | 510 nm | 460 nm |
|  | Multiple interference spectrum peak | 610 nm | 510 nm | 460 nm |
|  | Peak offset amount | 0 nm | 0 nm | 0 nm |
| Comp. Ex. 2 | Internal emission spectrum peak | 610 nm | 510 nm | 460 nm |
|  | Multiple interference spectrum peak | 656 nm | 510 nm | 460 nm |
|  | Peak offset amount | +46 nm | 0 nm | 0 nm |
| Comp. Ex. 3 | Internal emission spectrum peak | 610 nm | 510 nm | 460 nm |
|  | Multiple interference spectrum peak | 639 nm | 510 nm | 450 nm |
|  | Peak offset amount | +29 nm | 0 nm | −10 nm |
| Comp. Ex. 4 | Internal emission spectrum peak | 610 nm | 510 nm | 460 nm |
|  | Multiple interference spectrum peak | 620 nm | 514 nm | 450 nm |
|  | Peak offset amount | +10 nm | +4 nm | −10 nm |

Table 7 shows relative changes in display characteristics of the display apparatuses of Example 1 and Comparative Examples 1 to 4 with respect to the power consumption and the chromaticity difference of white color display depending on a viewing angle of the display apparatus of Comparative Example 1 in which the peak wavelength of an emission spectrum and the peak wavelength of a multiple interference spectrum are caused to coincide with each other for all the emission colors. The chromaticity difference of white color display was calculated by using Equation 2, and a relative change as compared to that of Comparative Example 1 is shown on the basis of the largest chromaticity difference value within the viewing angle range of 0 to 60°.

TABLE 7

Power consumption and chromaticity difference

|  | Power Consumption | Chromaticity Difference |
|---|---|---|
| Example 1 | 0.93 | 0.81 |
| Comparative Example 1 | 1.00 | 1.00 |
| Comparative Example 2 | 1.12 | 0.82 |
| Comparative Example 3 | 1.08 | 0.81 |
| Comparative Example 4 | 1.06 | 0.87 |

It can be seen from Table 7 that the display apparatus of Example 1 has both a reduced power consumption and a reduced chromaticity difference depending on a viewing angle as compared to those of the display apparatuses of Comparative Examples 1 to 4. The reason is considered that the superposition of the peak wavelength of an emission spectrum and the peak wavelength of a multiple interference spectrum is adjusted, the change in characteristics depending on a viewing angle is suppressed only for a device that emits light of a color having the highest visual sensitivity, and the peak wavelengths are caused to coincide with each other for the devices that emit lights of the other colors. Thereby, the emission efficiency of the device that emits light of the color having the highest visual sensitivity is lowered as compared to that in the case where the peak wavelengths are caused to coincide with each other. However, the devices that emit lights of the other colors become highly efficient devices because the peak wavelengths thereof are caused to coincide with each other. As a result, there can be provided a display apparatus which causes less color shift of a display image depending on a viewing angle, has good viewing angle display quality, and has a low power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-121960, filed Apr. 26, 2006, and Japanese Patent Application No. 2007-102752, filed Apr. 10, 2007, which are hereby incorporated by reference herein in their entirety.

What is claimed is:

1. A multicolor display apparatus comprising:
a plurality of organic light-emitting devices of different emission colors each comprising a cathode, an anode, and an organic compound layer formed between the cathode and the anode, the organic compound layer comprising a light-emitting layer,
wherein an optical path between a reflective surface which is closer to the cathode than the light-emitting layer is and a reflective surface which is closer to the anode than the light-emitting layer is, is set to serve as a resonating portion of a resonator structure for resonating light emitted by the light-emitting layer;
wherein in the organic light-emitting device showing the emission color with a highest visual sensitivity of the plurality of emission colors, a wavelength at which light is most intensified by the resonance is longer than a peak wavelength of an emission spectrum of the light-emitting layer such that a color shift depending on a viewing angle of a white color displayed by mixing the plurality of emission colors is suppressed; and
wherein in the organic light-emitting device showing an emission color other than the emission color with the highest visual sensitivity, a wavelength at which light is most intensified by the resonance coincides with a peak wavelength of the emission spectrum of the light-emitting layer.

2. The multicolor display apparatus according to claim 1, wherein the plurality of organic light-emitting devices of different emission colors comprise an organic light-emitting device that emits red light, an organic light-emitting device that emits green light, and an organic light-emitting device that emits blue light; and the organic light-emitting device showing the emission color having the highest visual sensitivity is the organic light-emitting device that emits green light.

3. The multicolor display apparatus according to claim 1, wherein a maximum difference in luminance changes of the respective emission colors depending on a viewing angle is 10% or less within a viewing angle range of 0° or more and 60° or less.

4. The multicolor display apparatus according to claim 1, wherein a chromaticity difference of the white color is 0.02 or less within a viewing angle range of 0° or more and 60° or less.

* * * * *